United States Patent [19]
Chiu et al.

[11] Patent Number: 6,067,025
[45] Date of Patent: May 23, 2000

[54] APPARATUS AND METHOD FOR DETECTING THE HEIGHT ABOVE A SILICON SURFACE

[75] Inventors: Anthony M. Chiu, Richardson, Tex.; Alan H. Kramer, Berkeley, Calif.

[73] Assignee: STMicroelectronics, Inc., Carrollton, Tex.

[21] Appl. No.: 08/984,007

[22] Filed: Dec. 3, 1997

[51] Int. Cl.[7] .................................................. G08B 21/00
[52] U.S. Cl. ...................... 340/686.5; 340/454; 360/110; 141/95; 141/96; 141/198; 29/603.1; 257/787; 324/699; 427/9
[58] Field of Search ................................ 340/454, 686.5, 340/453; 141/95, 96, 198; 29/1, 603.1; 257/787, 687, 701, 702, 704, 796; 360/110; 324/699; 73/104; 116/208; 702/34; 427/8, 9

[56] References Cited

U.S. PATENT DOCUMENTS

| | | | |
|---|---|---|---|
| 3,805,228 | 4/1974 | Peeples | 340/454 |
| 3,821,815 | 6/1974 | Abbott et al. | 360/110 |
| 4,014,141 | 3/1977 | Riddle et al. | 451/1 |
| 4,204,190 | 5/1980 | Wiley et al. | 340/454 |
| 4,456,098 | 6/1984 | Lindre | 188/1.11 L |
| 4,675,986 | 6/1987 | Yen | 29/603.1 |
| 5,559,286 | 9/1996 | White et al. | 73/129 |
| 5,666,325 | 9/1997 | Belser et al. | 367/95 |
| 5,833,033 | 11/1998 | Takanashi | 188/1.11 L |
| 5,907,477 | 5/1999 | Tuttle et al. | 361/760 |

*Primary Examiner*—Benjamin C. Lee
*Attorney, Agent, or Firm*—Theodore E. Galanthay; Lisa K. Jorgenson; Sanford E. Warren

[57] ABSTRACT

An apparatus and method for controlling the height of packaging above an integrated circuit package (30) comprising, a substrate (12), a silicon chip (16) and a signal wire (20), one or more height detection wires (32) extending above the top surface (26) of the silicon chip (16) and the signal wire (20) and a detector electrically connected to the height detection wire (32), wherein the height detection wire (32) and the detector form an electric circuit that is affected when a polisher of encapsulant (40) is in proximity to the height detection wire (32), is disclosed.

26 Claims, 3 Drawing Sheets

APPARATUS AND METHOD FOR DETECTING THE HEIGHT ABOVE A SILICON SURFACE

TECHNICAL FIELD OF THE INVENTION

The present invention relates in general to the field of integrated circuit assembly, and more particularly, to an apparatus and method for monitoring the distance between the silicon chip and the surface of the encapsulation material.

BACKGROUND OF THE INVENTION

Without limiting the scope of the invention, its background is described in connection with the manufacture of silicon chips for use in fixed-focus optical packaging, as an example.

Heretofore, in this field, the production of silicon chips for use in optical detection systems has failed to address the need for the higher tolerances required for the detection of higher quality images. For example, present methods of manufacturing fixed-focal length optical devices require manual intervention by the operator to position and focus the lens optics.

In current electro-optical packaging of image sensors the distance from the lens to the sensor (silicon) surface is critical to the correct focus of the image on the sensor plane. Control of this height must be accurate to within +/−30 μm and results in a higher quality image.

Manual adjustment adds costs due to the expense in equipment and personnel, and because it is a multi-step process. First, the lens must be positioned on the lens support structure and the lens adjusted in the proper focal plane. Once the lens has been adjusted, it must be fixed to the support structure or to the integrated circuit package containing the silicon chip.

Manual adjustment at both the adjustment and fixation steps adds to the overall cost of manufacturing of fixed-focal length digital optics in terms of the lens mount because the optics must be adjustable. Manual adjustment also requires that a threaded fitting is located in the lens support structure. Manual adjustment also adds to the overall cost of manufacturing due to the time spent adjusting and fixing the focus of the lens optics.

U.S. Pat. No. 4,782,288 (SGS Microelettronica S.p.A.) discloses a method for evaluating processing parameters in the manufacture of semiconductor devices, utilizing measurements such as width of lines created with lithographic techniques. In the disclosed method, a current of a known value is applied to a pair of reference resistive arms and a pair of test resistive arms, the voltages in each pair are measured, and the difference in conductance between the reference arms and the test arms is calculated. The specification does not address the need for achieving higher tolerances by monitoring the height of the encapsulation material in a semiconductor device relative to the silicon surface.

U.S. Pat. No. 4,406,949 (Mostek Corporation) discloses a method and apparatus for aligning an integrated circuit in which a laser beam is precisely focused onto a target surface of an integrated circuit in order to burn out the conductive lines of a specific circuit known to be defective, without harming the integrity of nearby conductive lines and circuit elements. The achieved result is the saving of a die on a wafer which would normally be discarded absent repair of the defect. The invention teaches detection of target structures and calculation of the distances between the structures, which are compared to desired parameters to effect rapid and precise focusing of the laser beam. The specification does not address the need for achieving higher tolerances by monitoring the height of the encapsulation material in a semiconductor device relative to the silicon surface.

A need has developed for a packaging solution that provides a package whose height is accurately controlled relative to the silicon surface. A packaging solution that allows for accurate control over the relative height of the lens over the silicon chip would eliminate the need of adjustable lenses and the focus step in the production process, leading to lower cost fixed-focus camera systems.

The present invention addresses the present needs by providing an apparatus and method for monitoring, controlling and adjusting the height of a lens support structure above the top surface of a substrate or silicon chip. The present invention allows the user to monitor the height of the plastic package over a silicon chip whose sidewalls are at a controlled height relative to the silicon surface. The control over the height is achieved at very high tolerances. The present invention accomplishes these high tolerances using present integrated circuit packaging methods of manufacture and equipment through the use of a polishing operation that polished down the height of the plastic package until it has reached the desired height above the silicon surface. The present invention uses height detection wires attached directly to the silicon surface on dedicated bonding pads during the normal bonding procedure to achieve the results disclosed herein.

SUMMARY OF THE INVENTION

The present invention is an apparatus and method for controlling the height of an encapsulant on an integrated circuit package. The apparatus of the present invention comprises, an integrated circuit package having a substrate, a silicon chip and signal wiring and one or more of height detection wires extending from the substrate to the silicon chip. The height of the height detection wires is higher than the signal wires that connect the silicon chip to the substrate.

In one embodiment of the present invention the height is measured from the top surface of the substrate. The substrate can be, for example, a printed circuit board or a semiconductor chip. The semiconductor chip can be a silicon chip. A detector is electrically connected to the height detection wires. The height detection wires and the detector form a circuit that is affected when the height detection wires are cut during polishing of the encapsulant. A lower cost lens system can be used if control of the height can be maintained to within +/−15 μm.

In one embodiment of the present invention a method of monitoring the height of an encapsulant above an silicon chip having a height detection wire is disclosed. The method comprises the steps of, measuring the bias of a circuit formed by a height detection wire and a detector, polishing the surface of an encapsulant to the height detection wire and detecting a change in the circuit. Once a change in the circuit has been detected, polishing of the encapsulant above the silicon chip is ended. For example, the change in the status of the height detection wire can be as a result of cutting the height detection wire, a change in current, an increase in resistance due to a reduction in the wire cross-section or electrical contact with the wire. Alternatively, the change in the status of the height detection wire can be a change in capacitance or inductance caused by proximity of the polishing wheel to the height detection wire.

Current solutions do not allow for precise control of the lens height above the package during the polishing operation. One reason for lack of control during the polishing operation is that the height of package relative to the silicon chip surface is presently controlled via programming of the polishing equipment only, thereby failing to achieve the tolerances needed. Therefore, a manual focusing operation is needed following lens integration. During this step, the lens is adjusted until the output image is correctly focused and then the lens is fixed in that position, either with adhesive or a fixing screw. The process of adjusting the lens by means of an adhesive or fixing screw is time-consuming and difficult to automate. The present invention overcomes the problems associated with manual focusing of optical systems by providing for an apparatus and method for focusing the system using height detection wires.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
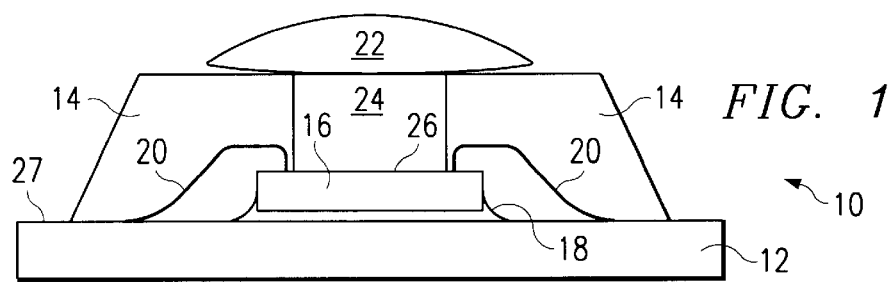
FIG. 1 is a cross sectional view of a fixed-length optical apparatus.

The present invention is described in relation with the following figures. FIG. 1 shows a cross sectional view of a fixed-length optical integrated circuit package, or camera chip 10 that can be produced using the apparatus and method of the present invention. The camera chip 10 has a substrate 12 to which a silicon chip 16 is attached by means of an adhesive layer 18. The silicon chip 16 has a top surface 26, and the substrate 12 has a top surface 27. The silicon chip 16 can be substituted with other semiconductor materials.

The camera chip 10 has lens footings 14 that serve to mechanically protect signal wires 20 from the environment. Lens footings 14 support lens 22 at a position that has a fixed length above the top surface 26 of silicon chip 16. Both the height of the silicon chip 16 relative to the substrate 12, as well as the planarity of the silicon chip 16 relative to the planar surface of the substrate 12, generally, need to be controlled. An opening 24 within the lens footing 14 allows, for example, visible light to cross the lens 22, and to be focused on the silicon chip 16. The silicon chip 16 may be, for example, a charge-coupled display sensor. Other digital or analog-based sensors may be used with the present invention.

Figure 2A:
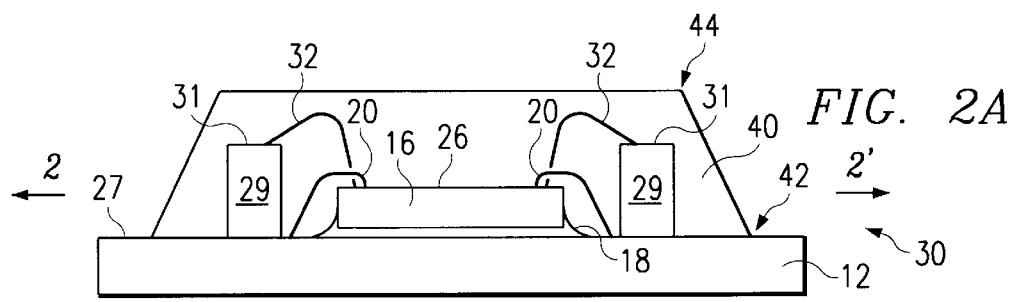
FIG. 2 is a cross sectional view of an apparatus of the present invention.

FIG. 2A shows a cross sectional view of an integrated circuit package 30 prior to processing into a camera chip 10 such as the one depicted in FIG. 1. Integrated circuit package 30 has a substrate 12 to which a silicon chip 16 is attached by means of an adhesive layer 18. An encapsulant 40 surrounds and protects the signal wire 20 from the environment. The encapsulant 40 can be an opaque or a transparent encapsulant. In case of opaque encapsulant, a cavity is formed during molding. If the encapsulant 40 is transparent, the nature of the transparence can match the wavelength of the input that will be detected by the silicon chip 16. Signal wire 20 and height detection wire 32 are depicted extending from a bonding spacer 29 on the silicon chip 16. The bonding spacer can be, for example, molded or glued onto the surface 27 of silicon chip 16. Electrical connectivity between the top 31 of the bonding spacer 29 and the surface 27 of the silicon chip can be provided for integration into an electrical detection system disclosed hereinbelow. The bonding spacer 29 is depicted as rectangular in shape, however, other shapes may be used in conjunction with the present invention. The height detection wire 32 is stitched a distance that is farther from the upper surface 26 of the silicon chip 16 than the signal wire 20 and which is set based on the focal-length of the lens or the lens system (not depicted). The encapsulant 40 is depicted having a trapezoidal shape, however, other shapes are encompassed within the present invention. The encapsulant 40 has a lower mold line 42 and an upper mold line 44 that form the outline of the encapsulant 40.

Figure 2B:
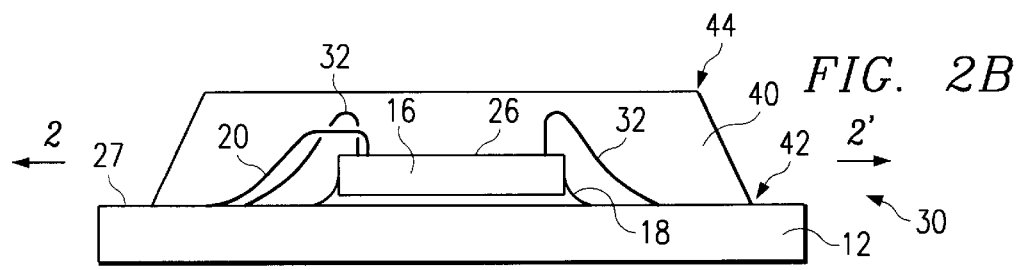

FIG. 2B shows a cross sectional view of an integrated circuit package 30 prior to processing. Integrated circuit package 30 has a substrate 12 to which a silicon chip 16 is attached by means of an adhesive layer 18. An encapsulant 40 surrounds and protects the signal wire 20 from the environment. The encapsulant 40 can be an opaque or a transparent encapsulant as described in connection with FIG. 2A.

Signal wire 20 and height detection wire 32 are depicted extending to the silicon chip 16. The height detection wire 32 is stitched a distance that is farther from the upper surface 26 of the silicon chip 16 than the signal wire 20 and which is set based on the focal-length of the lens or the lens system as depicted in FIG. 1. The encapsulant 40 is depicted having a trapezoidal shape, however, other shapes are encompassed within the present invention. The encapsulant 40 has a lower mold line 42 and an upper mold line 44 that form the outline of the encapsulant 40.

Figure 3:
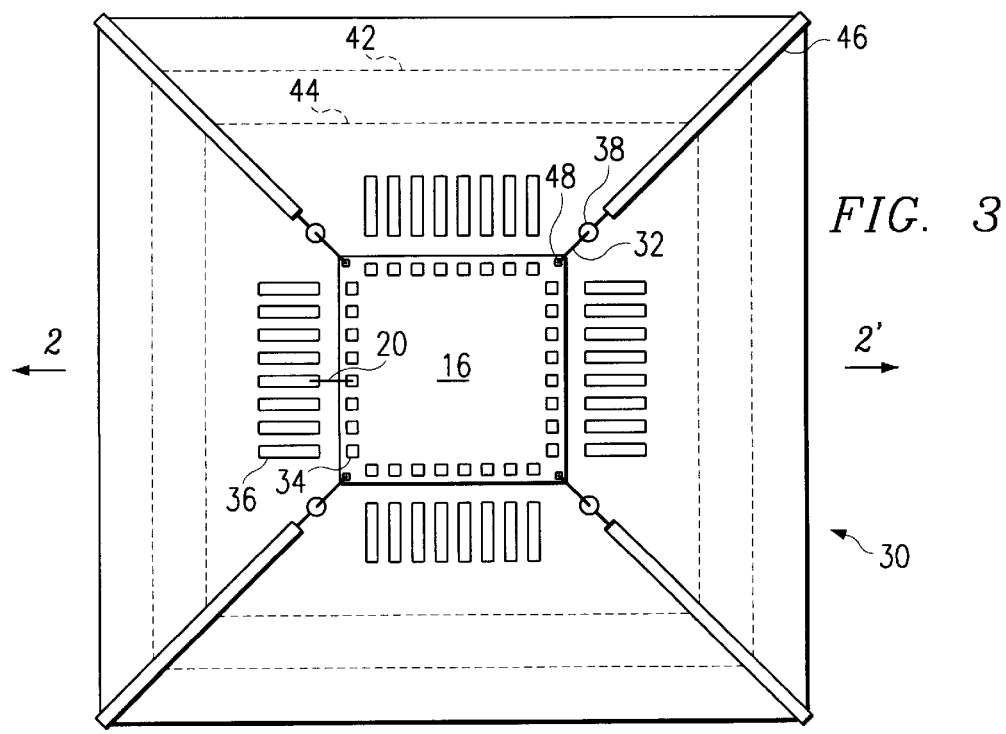
FIG. 3 is a top view of an apparatus of the present invention.

FIG. 3 shows a top view of an integrated circuit package 30 prior to processing into a camera chip 10. Signal wire 20 is bonded from a signal pad 34 to a landing pad 36 on the substrate 12. Signal wire 20 uses standard or low-profile wire loops of, for example, six or fewer mils.

Height detection wire 32 is connected to a height detection pad 38, which is connected to a conduit 46, both on the substrate 12. The conductor 46 can be connected to a detection device (not depicted) such as an Ohm-meter that reports on the status of the circuit formed by the height detection wire. The height detection wire 32 can be connected to a die pad 48 on the surface of the silicon chip 16. A circuit is formed from the detector through the conductor 46, through the height detection wire 32, through the silicon chip 16 to the other end of the detector. Alternatively, an ammeter or a voltmeter can be used as a detector to measure changes in the status of the height detection wire 32 during processing.

Four height detection wires 32 are depicted in FIG. 3 and are bonded to four dedicated height detection pads 38 in the four corners of the silicon chip 16 using wire loops with heights that are greater than the standard heights of signal wires 20. The height of the height detection wires 32 is between the height above the signal wires 20 and the encapsulant 40. The height detection wire 32 must have a height significantly greater than that used for the signal wire 20. The height will be limited by accuracy and focal-length constraints of the lens and by practical limitations. Typically a height above the signal wire 20 of less than 15 mils will be used. A higher loop for height detection wire 32 can be made with bonding spacers 29.

The height detection wire 32 and the signal wire 20 are covered by an encapsulant 40, such as a plastic extruded through a molding or plastic application step. The encapsulant 40, such as a transfer molding, is applied using typical chip-on-board style packaging. In the case of packaging sensors such as camera chips 10, plastic must be applied only to the signal wires 20 including signal pads 34 and landing pads 36. As used with the present invention, and using the techniques described here, the encapsulant 40 will generally cover all signal wires 20, including the four height detection wires 32 depicted in FIG. 3.

Figure 4A:
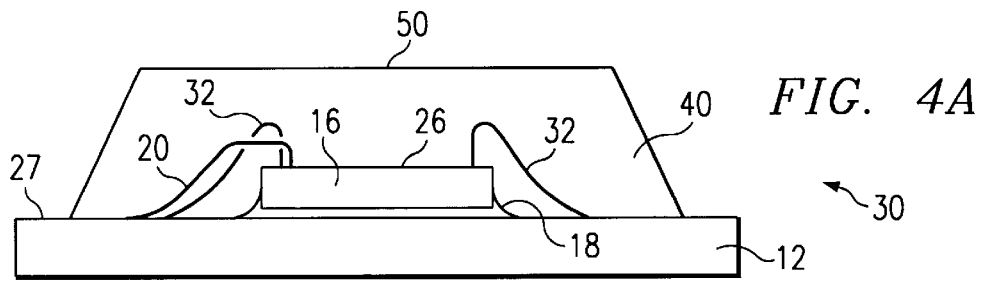
FIGS. 4a–c are cross sectional views of the processing steps involved in an embodiment of the method of the present invention.
Figure 4B:
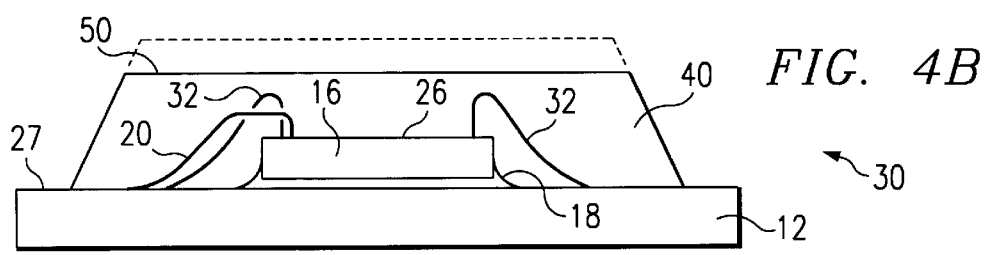
Figure 4C:
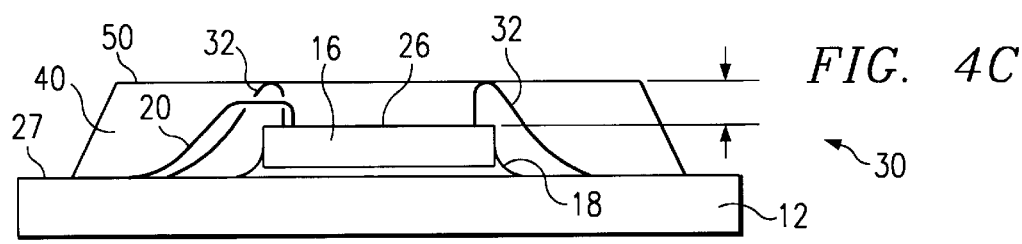

FIGS. 4a through 4c depict a progression of the processing steps used in one embodiment of the present invention to obtain a fixed focal-length integrated circuit package 30. The top surface 50 of the encapsulant 40 is polished using a standard encapsulant polisher, which is adapted to be controlled by four signals coming from the height detection wires 32, as measured by a detector that is connected to circuit formed by the height detection wires 32. One of these connections may be made through the silicon chip 16. The detector can be connected to each of these height detection wires 32 either separately, or as part of the same circuit. In one embodiment, a ground signal is applied directly to the silicon chip 16 or to the substrate 12. The four height control wires 32 act as open-short detection points. Alternatively, the entire polishing operation may be controlled via a single height detection wire 32.

In operation, the top surface 27 of the substrate 12 and the four height detection pads are connected to the silicon chip 16, either directly or through substrate contacts or through integrated diodes. At the detector, a current bias generator is connected to each of the four height detection circuits of the integrated circuit package 30. As long as the height detection control wire or wires 32 is (are) intact, the voltage, current, resistance, capacitance or inductance measured at the detector on the substrate 12 end of the current source will be near the substrate bias.

The substrate bias would be the same in the case of the direct substrate contact, or Vt in the case of a through-diode connection. The top surface 50 of the encapsulant 40 is then polished until the polishing operation breaks or affects a height detection wire 32. Breakage of the height detection wire 32, for example, changes the bias measured at the detector on the substrate 12 side of the current source. The bias will rise to the saturation voltage of the current source as the current no longer has a low impedance path to the substrate 12.

The polishing operation continues until the polisher detects that the polishing operation has broken or affected one or more of the height detection wires 32. In the case that all four of the height detection wires 32 are broken or affected simultaneously, the polishing operation terminates. In this case, the correct height above the silicon chip 16 surface has been attained and the proper focal length for the lens footing reached.

Figure 5A:
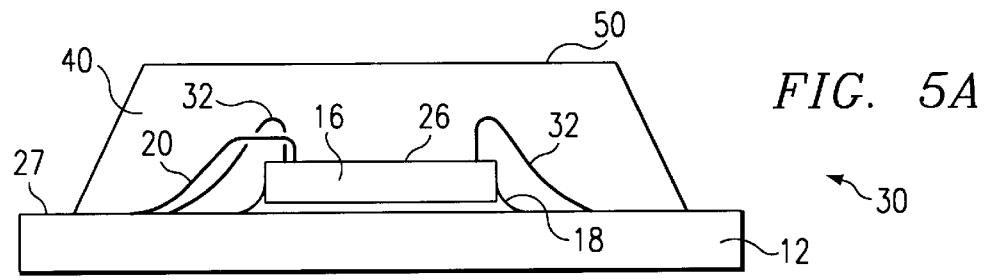
FIGS. 5a–d are cross sectional views of alternative processing steps involved in an embodiment of the method of the present invention.
Figure 5B:
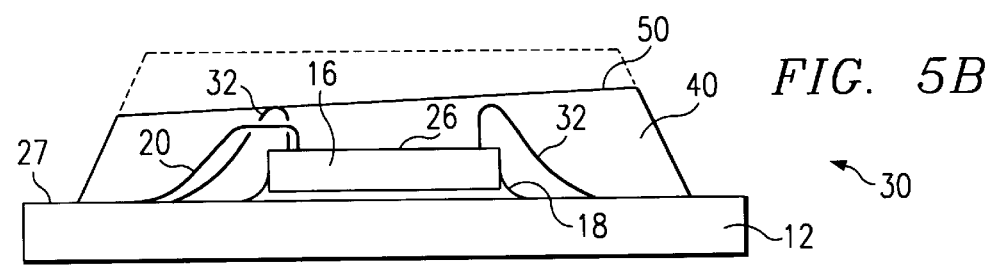
Figure 5C:
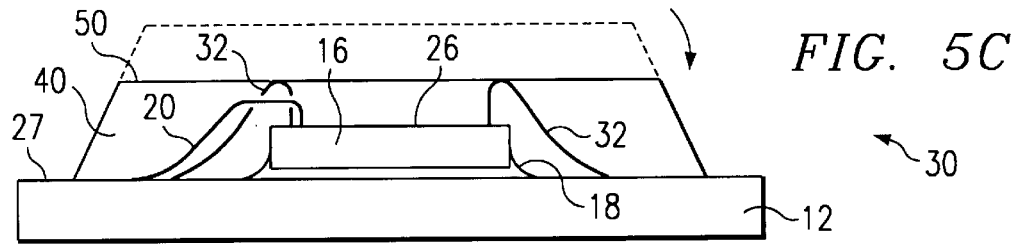
Figure 5D:
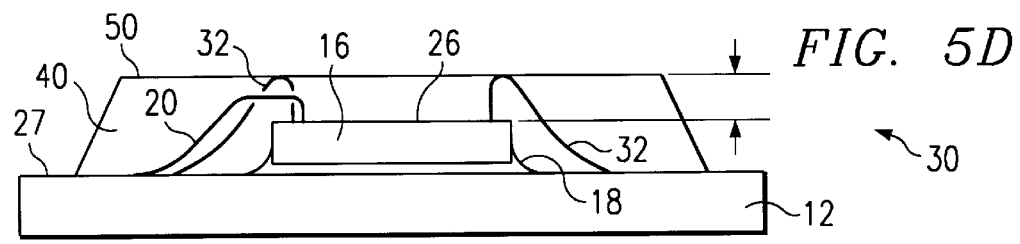

FIGS. 5a through 5d show the progression of processing steps of the present invention. FIG. 5a is a cross sectional view of an integrated circuit package 30 as described hereinabove. In this progression at least one, but fewer than all four, of the height detection wires 32 are broken by the polishing operation. As depicted in FIG. 5b the top surface 50 is not exactly parallel with respect to the top surface 26 of silicon chip 16. Therefore, the tilt of the polisher is adjusted to terminate polishing the top surface 50 above the height detection wire 32 that has been broken, as shown in FIG. 5c.

Alternatively, if two wires along one side of the integrated circuit package 30 have been broken, polishing is terminated along the line, between those two height detection wires 32 by adjusting the polishing head, while polishing continues on the remaining corners or remaining side of the integrated circuit package 30 along top surface 50. If three height detection wires 32 are broken or two diagonally opposed height detection wires 32 are broken, either the silicon surface is not planar or the height detection wires 32 are not of equal height—in either of these cases the actions to take will depend on the nature of the problem and the specific application to which the result will be applied. When the remaining height detection wires 32 have been broken the polishing operation terminates.

Figure 6:
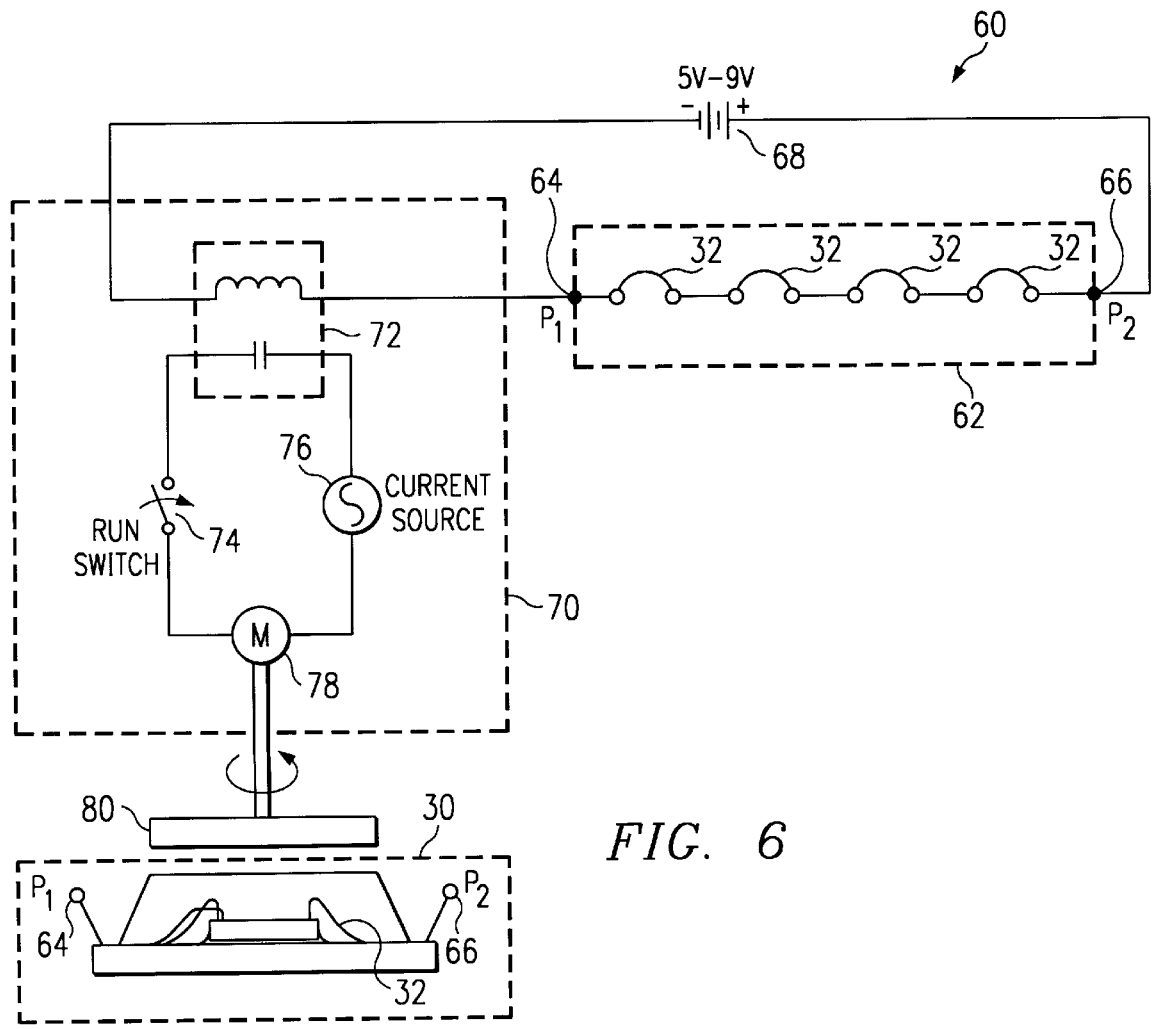
FIG. 6 is a high level schematic depicting a functional embodiment of the design of the current invention.

Turning now to FIG. 6 where a high level schematic depicting a functional embodiment of the design is illustrated and denoted generally as 60. The functional embodiment 60 comprises an IC 30, polisher 78, series circuit 62, height detection circuit 70 and a 5 to 9 volt DC source 68 from substrate 12. Circuit 62 comprises four height detection wires 32 connected in series with the height detection circuit 64 at P1 64 and P2 66. The physically connected substrate provides a 5 to 9 volt DC voltage source 68 creating a point of measurement across detector circuit 70. Height detection circuit 70 comprises tank circuit 72, an operations switch 74, a current source 76 and motor 78 to drive polisher 80.

Series circuit 62 is magnetically coupled 72 to run switch 74 and current source 76. Upon activation of switch 74, current source 76 provides power to motor 78, thus driving polisher 80. As long as continuity exist in circuit 62, the impedance across tank circuit 70 will maintain the bias operating point for current source 76, thus effectively driving motor 78.

When polisher 80 makes contact with the height detection wire or wires 32 and cuts through the height detection wire 32 a discontinuity is created and the impedance across tank circuit 72 increases infinitely causing the bias current to increase beyond current source 76's saturation level. Current source 76 becomes inoperable and the motor ceases to drive polisher 80. The above description describes one example to effectively detect the height above a silicon surface, although other more sophisticated embodiments may be employed such as, to provide for level detection across the planar surface and the capacity to correct for an uneven polish across the silicon surface.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

For example, while optical devices have been described, the invention can be used in other applications where control of the height above the semiconductor circuit is critical. One example of such a device is a fingerprint sensor, where wavelengths in the infrared spectrum are detected, through, for example, germanium doped lenses. It is therefore intended that the appended claims encompass any such modifications or embodiments.

What is claimed is:

1. An apparatus for controlling the height of an encapsulant above the top surface of a semiconductor comprising:

a height detection wire extending from said top surface; and a detector electrically connected to the height detection wire to detect when the height detection wire is affected during polishing of the encapsulant.

2. The apparatus of claim 1, wherein said semiconductor forms part of a fixed-focus optical package.

3. The apparatus of claim 1, wherein said semiconductor is formed on a silicon substrate.

4. The apparatus of claim 1 further comprising:

a plurality of height detection wires forming independent circuits.

5. The apparatus of claim 4 wherein processing is terminated once any of the circuits are affected.

6. The apparatus of claim 4 wherein processing continues until all the circuits are affected.

7. The apparatus of claim 4 wherein polishing of the encapsulant is terminated above the area where a circuit has been affected.

8. The apparatus of claim 4 wherein the number of height detection wires is four.

9. The apparatus of claim 1 further comprising:

a plurality of height detection wires connected to form one circuit.

10. The apparatus of claim 9 wherein polishing of the encapsulant continues until the circuit is affected.

11. The apparatus of claim 9 wherein the number of height detection wires is four.

12. An apparatus for controlling the height of an encapsulant above the top surface of a semiconductor that forms part on an integrated circuit package comprising:

an integrated circuit package having a substrate, a silicon chip and signal wiring;

at least one height detection wire extending from the substrate to the silicon chip, the height detection wire extending higher than said signal wiring; and a detector electrically connected to the height detection wires to detect when the height detection wire is affected during polishing of the encapsulant.

13. The apparatus of claim 12, wherein said semiconductor forms part of a fixed-focus optical package.

14. The apparatus of claim 12, wherein said semiconductor is formed on a silicon substrate.

15. The apparatus of claim 12 wherein each of the height detection wires that comprise the plurality of height detection wires form independent circuits.

16. The apparatus of claim 15 wherein polishing of the encapsulant is terminated once any of the circuits are affected.

17. The apparatus of claim 15 wherein polishing of the encapsulant continues until all the circuits are affected.

18. The apparatus of claim 15 wherein polishing of the encapsulant is terminated above the area where a circuit has been affected.

19. The apparatus of claim 12 wherein the number of height detection wires is four.

20. The apparatus of claim 12 wherein the plurality of height detection wires forms one circuit.

21. The apparatus of claim 20 wherein processing continues until the circuit is affected.

22. A method of monitoring the height of an encapsulant above an silicon chip having a height detection wire comprises the steps of:

measuring the bias of a circuit formed by a height detection wire at a detector;

polishing the surface of an encapsulant to the height detection wire;

detecting a change in the circuit; and ending polishing of the encapsulant once the circuit has been detected.

23. The method of claim 22 wherein the integrated circuit package comprises at least three height detection wires that form a plane.

24. The method of claim 23 wherein the three height detection wires that form a plane form independent circuits that are connected to a detector.

25. The method of claim 24 further comprising the steps of:

detecting the order in which the circuits formed by the three height detection wires and the detector are affected;

ending processing over the position of the circuit that has been affected;

tilting the polishing head away from the circuit that has been affected; and ending overall processing when all three circuits have been affected.

26. The method of claim 22 wherein the number of height detection wires is four.

* * * * *